(12) United States Patent
Huang et al.

(10) Patent No.: US 6,479,376 B1
(45) Date of Patent: Nov. 12, 2002

(54) PROCESS IMPROVEMENT FOR THE CREATION OF ALUMINUM CONTACT BUMPS

(75) Inventors: Kun-Ming Huang, Taipei (TW); Cheng-Wei Lee, Hsin-Chu (TW); Ding-Jeng Yu, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/808,925

(22) Filed: Mar. 16, 2001

(51) Int. Cl.$^7$ .............................................. H01L 21/44
(52) U.S. Cl. ...................... 438/613; 438/614; 438/634; 438/699
(58) Field of Search .................. 148/DIG. 51, DIG. 81, 148/DIG. 131; 257/40, 737, 751, 752, 754, 758, 759, 760, 761, 764, 765, 768, 773, 774, 776; 438/613, 614, 622, 623, 624, 626, 629, 631, 634, 699, 763, 787, 970

(56) References Cited

U.S. PATENT DOCUMENTS

| | | | |
|---|---|---|---|
| 5,061,985 A | 10/1991 | Meguro et al. | 357/68 |
| 5,886,410 A | 3/1999 | Chiang et al. | 257/759 |
| 6,130,149 A | 10/2000 | Chien et al. | 438/613 |

OTHER PUBLICATIONS

Wolf and Tauber, "Sil;icon processing for the VLSI Rea", vol. 1., Chapter 15, p 514, Lattice press, 1986.*

* cited by examiner

*Primary Examiner*—Vinh P. Nguyen
*Assistant Examiner*—Asok Kumar Sarkar
(74) *Attorney, Agent, or Firm*—George O. Saile; Stephen B. Ackerman

(57) ABSTRACT

A new method is provided for the creation of an aluminum bump on a surface of a semiconductor device. A patterned layer of aluminum overlying a substrate is created, the patterned layer of aluminum is the layer of aluminum over which a contact bump is to be created. A layer of passivation is deposited, a first layer of photoresist is deposited for the creation of an opening in the layer of passivation that partially exposed the surface of the patterned layer of aluminum. This patterned first layer of photoresist remains in place, a layer of aluminum is sputter deposited, a second layer of photoresist is deposited which is patterned and etched for the creation of the aluminum bump overlying the patterned layer of aluminum. The aluminum solder bump is created by etching the deposited layer of aluminum. After the solder bump has been created, the patterned first and the second layers of photoresist are removed in one processing step, leaving in place the solder bump.

16 Claims, 5 Drawing Sheets

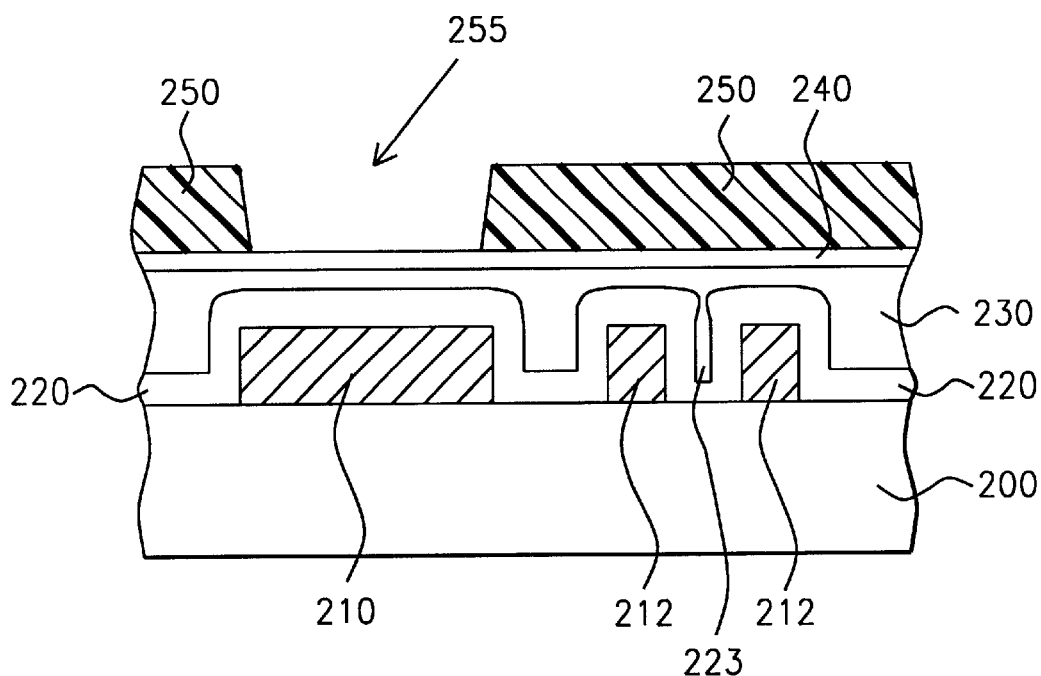
FIG. 1a – Prior Art
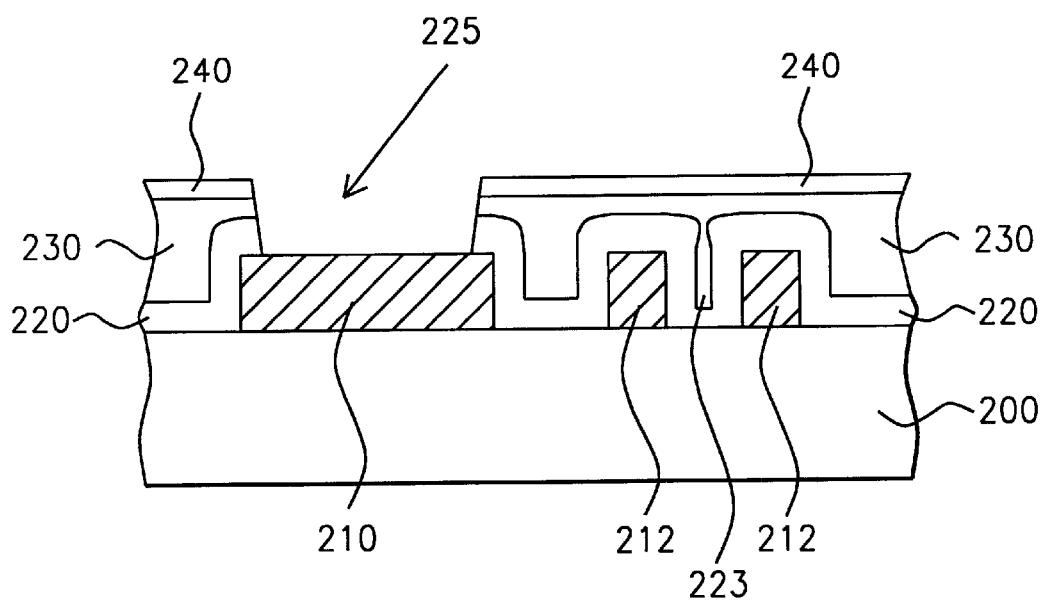
FIG. 1b – Prior Art

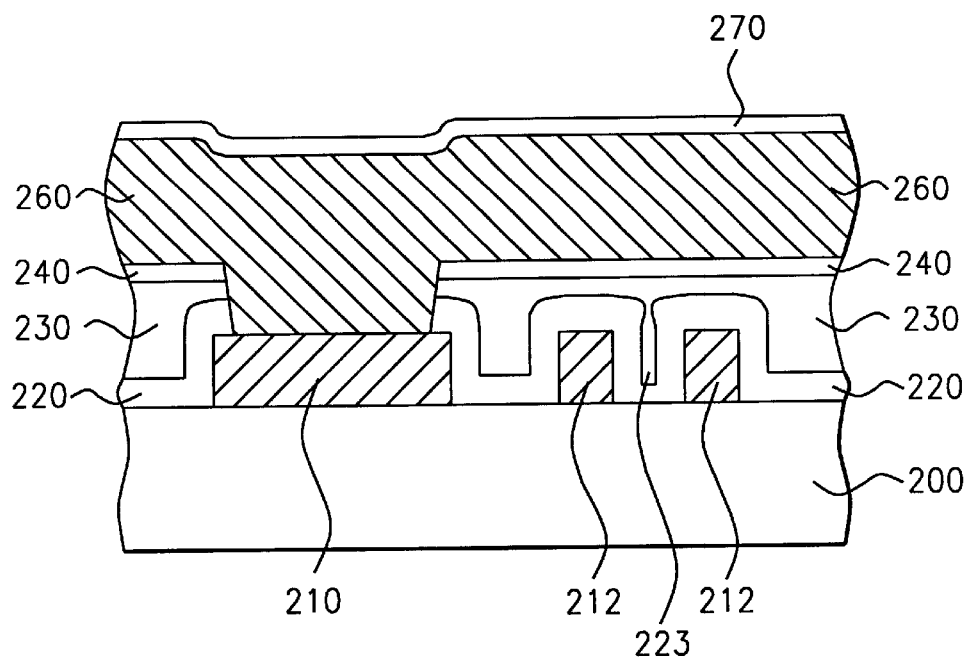
FIG. 1c – Prior Art
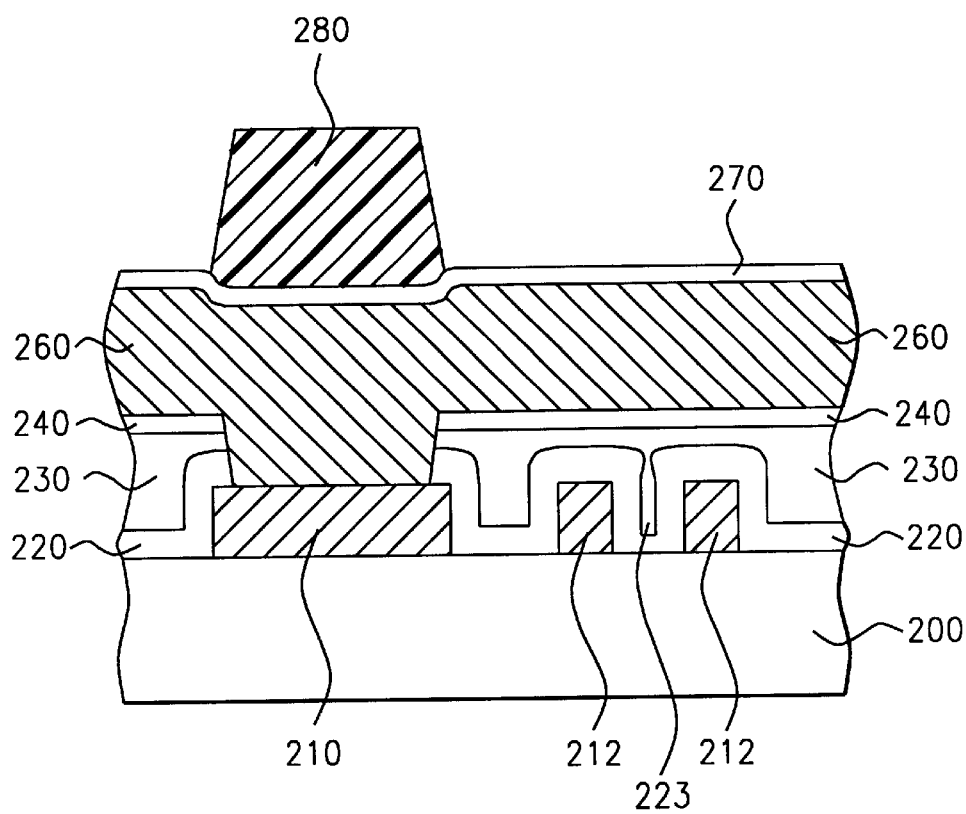
FIG. 1d – Prior Art

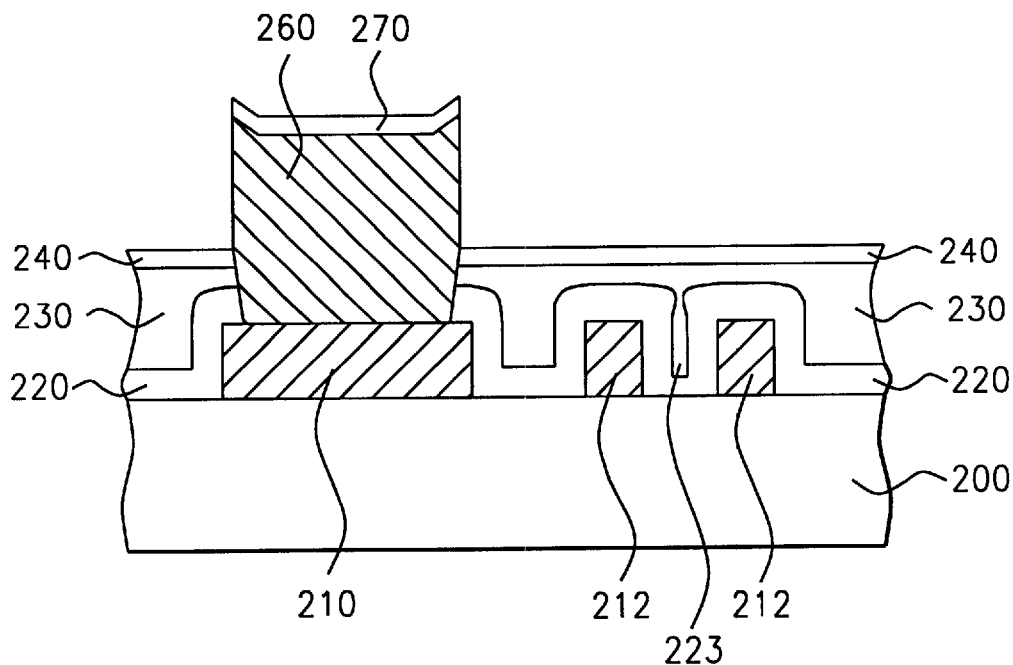
FIG. 1e – Prior Art
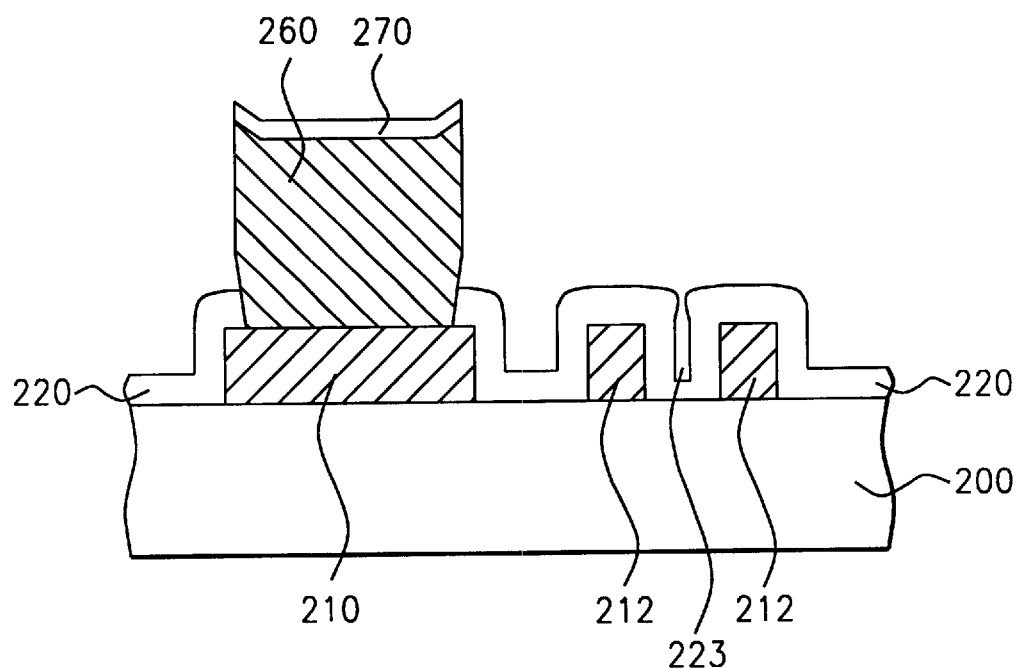
FIG. 1f – Prior Art

PROCESS IMPROVEMENT FOR THE CREATION OF ALUMINUM CONTACT BUMPS

BACKGROUND OF THE INVENTION (1) Field of the Invention

The invention relates to the fabrication of integrated circuit devices, and more particularly, to a improved method of providing aluminum contact bumps on a semiconductor surface.

(2) Description of the Prior Art

The conventional method that is used for the creation of semiconductor devices simultaneously creates numerous devices and device features on the surface of a semiconductor substrate, after the devices in or on the surface of the substrate have been completed the substrate is cut (diced) for the formation of individual die. The device circuitry that is internal to the device is connected to device input/output (I/O) points of electrical contact. These I/O points of electrical contact to the die must, after the individual die has been created, be further connected to either other semiconductor devices or to a packaging interface. A completed and diced semiconductor die can be connected at a first or card level, which can be further connected to a second or board level of interconnect.

A number of different techniques are used to further interconnect a completed semiconductor device. Wire bonding is frequently used for this purpose, where a (for instance) gold wire is bonded to I/O points of interconnect of the device. Another frequently applied interconnect method uses Tape Automatic Bonding (TAB), wherein the device is attached to an underlying flexible tape in the surface of which points of contact have been provided. The tape typically contains interconnect lines or traces that further route the device I/O points to other points of interconnect. Yet another method uses contact or solder bumps that are provided for this purpose on a surface, for instance the surface of a metal panel or the surface of a printed circuit board. The interconnect in this case is achieved by flowing the solder of the solder bump, fusing two points of electrical contact together and establishing electrical continuity. This latter method is frequently referred to, due to the nature in which the electrical continuity is established, as the Controlled Collapse Chip Connection or C4. For all these methods that are used to further interconnect completed and diced semiconductor devices, it is clear that distinct and well identifiable points of contact must be provided through which the electrical continuity is established.

The continuing decrease in semiconductor device feature size, a decrease that is driven by the dual requirements of improved device performance and reduced device manufacturing cost, has over the years resulted in placing increased emphasis on device packaging. This trend has further, due to a significant increase in semiconductor device density, placed increased emphasis on device or package I/O capabilities. The metal connections, which connect the Integrated Circuit to other circuit or system components, have therefore become of relative more importance and potentially have, with the further miniaturization of the IC, an increasingly negative impact on the circuit performance. If the parasitic capacitance and resistance of the metal interconnections increases, the chip performance can be significantly degraded. Of most concern in this respect is the voltage drop along the power and ground buses and the RC delay of the critical signal paths. Attempts to reduce the resistance by using wider metal lines result in higher capacitance of these wires.

Packaging requirements have influenced and driven not only internal device design aspects but have in addition led to a number of different approaches of creating the arrays of I/O points that are required to interconnect the device. These different approaches of making I/O points of interconnect available have led to a number of different device types, most notably the Ball Grid Array (BGA) device, the flip chip and the Slightly Larger than Integrated Circuit Carrier (SLICC). Other device configurations are known as Land Grid Array (LGA) devices, Pin Grid Array (PGA) devices, Chip Scale Packaging (CSP) devices and Quad Flat Pack (QFP) devices.

Some of these devices will be briefly highlighted since the method in which these devices are further interconnected relates to the invention.

BGA devices are provided with an array of solder balls that is arranged across the active surface of the die. The solder balls are positioned above and make contact with points of electrical contact that have been provided in a higher level of interconnect, such as a printer circuit board or a metal panel. By flowing the solder balls of the BGA device after contact has been established to the higher level of interconnect, the BGA device is electrically connected to the higher level of interconnect.

Flip chip attachments make use of the design of the flip chip. Points of electrical contact have been provide in the upper surface of the chip, the chip is turned upside down (inverted or flipped), the contact points that have been provided in the upper surface of the chip now face downwards and can be aligned with contact points that have been provided in an underlying interconnect interface such as a metal panel or a printed circuit board. The contact points in the underlying interconnect interface are typically connected to conductive traces for further routing of the interconnection that is provided for the flip chip. By providing and flowing a solder flux to the interfaces between the flip chip and the underlying interconnect interface, electrical contact between these two entities is established.

The SLICC device is similar to the BGA device with the exception that the pitch and the diameter of the solder balls of the BGA is reduced, allowing for increased I/O interconnect.

Many of the I/O interconnect methods, some of which have been highlighted above, use a solder bump as the essential means of creating the interconnect. A conventional procedure for forming a solder bump will be briefly highlighted following.

The procedure starts with a semiconductor surface that has been provide with a for instance aluminum point of electrical contact in the surface thereof. A layer of passivation is deposited over the surface, the layer of passivation is patterned and etched creating an opening in the layer of passivation that aligns with the aluminum contact point in the semiconductor surface. A barrier and/or seed layer can next be deposited over the surface of the layer of passivation, including the inside surfaces of the opening that has been created in the layer of passivation. The surface of the metal barrier layer must next be prepared for the deposition of the solder bump. For this purpose, an etch resistant layer is deposited over the surface of the metal barrier and patterned, creating an opening in the etch resistant layer that aligns with the point of electrical contact. Next, the material that is used for the solder bump is deposited by methods of plating or lamination over the surface of the etch resistant material, filling the opening with the material of the solder bump. The surface of the solder bump material can be polished down to the surface of the etch resistant layer. The etch resistant layer is then removed leaving the solder bump in place overlying the point of electrical contact in the semiconductor surface and electrically connected therewith.

A second method, following Chien et al., U.S. Pat. No. 6,130,149 will also be highlighted. This method addresses forming a cubical aluminum bump on the surface of an integrated circuit chip. This method starts with the surface of a semiconductor substrate, semiconductor devices have been created in or on the surface of the substrate, points of electrical contact to the devices have been made available in the surface of the substrate. A layer of aluminum is deposited over the surface of the substrate, this layer of aluminum is patterned and etched leaving a layer of patterned aluminum overlying points of electrical contact in the surface is the substrate. It must be realized in this that a number of layers of dielectric may be interposed between the layer of aluminum and the surface of the substrate, these layers of dielectric may further be provided with conductive interconnect lines in or on the surface thereof. Essential is that a point of aluminum (or copper) contact is provided over which an aluminum bump is to be formed for ultimate contact with the devices that have been created in or on the surface of the substrate. A layer of passivation is deposited over the surface of the substrate, including the surface of the patterned aluminum layer that has been created overlying a point of electrical contact in the surface of the substrate. Chien et al. address the formation of (undesired) metal or any other contaminants between relatively closely spaced interconnect lines that are present in the vicinity of the aluminum pad. To prevent this from occurring, a composite layer of dielectric is formed over the surface of the layer of passivation. The composite layer of dielectric comprises first a layer of Spin-On-Glass (SOG), the layer of SOG is planarized after which a layer of Plasma Enhanced Oxide (PEOX) is deposited over the surface of the layer of SOG. The layer of SOG fills openings between closely spaced interconnect lines, preventing any contaminants from accumulating between adjacent metal lines. The layer of passivation, SOG and PEOX are next patterned and etched, creating an opening in these three layers that penetrates the layers and partially exposes the surface of the patterned layer of aluminum. A layer of metal, preferably of aluminum, is deposited over the surface of the layer of PEOX, filling the opening created in the three layers of passivation, SOG and PEOX. A composite layer, which is patterned as a hard mask overlying the patterned layer of aluminum, is created over the surface of the layer of metal. The layer of metal can now be etched, removing the metal from above the surface of the layer of PEOX while leaving the metal in place underneath the hard mask that is overlying the patterned layer of aluminum. Further removing of the layers of PEOX and SOG leaves in place a layer of metal (preferably of aluminum) over which the hard mask remains in place and the (adjacent or surrounding) interconnect lines over the surface of which the layer of passivation remains in place for protection of the interconnect lines.

Numerous other examples of the creation of conductive bumps can be cited. A number of the methods for making conductive bumps use a triple layer of Under Bump Metallurgy (UBM), typically a layer of Cr over which a Cr—Cu alloy over which a layer of Cu, for the base layer of a solder bump, the solder bump can then be created.

The invention addresses the creation of aluminum bumps that has as objective the prevention of the accumulation of impurities between adjacent interconnect lines.

U.S. Pat. No. 6,130,149 (Chien et al. shows an Al bump process.

U.S. Pat. No. 5,886,410 (Chiang et al.) shows an interconnect process with Al and photoresist strip steps.

U.S. Pat. No. 5,061,985 (Meguro et al.) discloses another bump process.

SUMMARY OF THE INVENTION

A principle objective of the invention is to provide a method of forming an aluminum bump on the surface of an integrated circuit device.

Another objective of the invention is to provide a method of creating an aluminum bump on the surface of an integrated circuit device without leaving any aluminum residue in place on the surface of the layer of passivation of the device.

In accordance with the objectives of the invention a new method is provided for the creation of an aluminum bump on a surface of a semiconductor device. A patterned layer of aluminum overlying a silicon substrate is created, the patterned layer of aluminum is the layer of aluminum over which a contact bump is to be created. A layer of passivation is deposited, a first layer of photoresist is deposited for the creation of an opening in the layer of passivation that partially exposed the surface of the patterned layer of aluminum. This patterned first layer of photoresist remains in place, a layer of aluminum is sputter deposited, a second layer of photoresist is deposited which is patterned and etched for the creation of the aluminum bump overlying the patterned layer of aluminum. The aluminum solder bump is created by etching the deposited layer of aluminum. After the solder bump has been created, the patterned first and the second layers of photoresist are removed in one processing step, leaving in place the solder bump.

BRIEF DESCRIPTION OF THE DRAWINGS

FIGS. 1a through 1f address a prior art method of creating aluminum bumps, as follows:

FIG. 1a shows a cross section of a semiconductor surface that has been provided with points of electrical contact, layers of passivation, Spin-On-Glass (SOG) and PEOX have been deposited. A patterned first layer of photoresist is created over the surface of the deposited layers.

FIG. 1b shows the cross section after the deposited layers have been etched in accordance with the pattern that has been created in the overlying first layer of photoresist, the first layer of photoresist has been removed.

FIG. 1c show the cross section after a layer of aluminum over which a hard mask layer have been deposited.

FIG. 1d shows a cross section after a patterned second layer of photoresist has been created on the surface of the hard mask layer.

FIG. 1e shows a cross section after the hard mask layer and the layer of aluminum have been etched in accordance with the patterned second layer of photoresist.

FIG. 1f shows a cross section after the layers of dielectric have been removed, leaving in place an aluminum solder bump and adjacent interconnect lines that are protected by a layer of passivation.

FIG. 2a shows a cross section of a silicon substrate, points of electrical contact have been provided on the surface of the substrate, a patterned layer of passivation has been created over the surface of the substrate, the first layer of photoresist hat has been used to pattern the layer of passivation remains in place.

FIG. 2b shows the cross section after a layer of aluminum has been deposited.

FIG. 2c shows a cross section after a second patterned layer of photoresist has been created over the surface of the layer of aluminum.

FIG. 2d shows a cross section after the layer of aluminum has been etched in accordance with the second patterned layer of photoresist.

FIG. 2e shows a cross section after the first and the second patterned layers of photoresist have been removed.

DESCRIPTION OF THE PREFERRED EMBODIMENTS

Figure 2A:
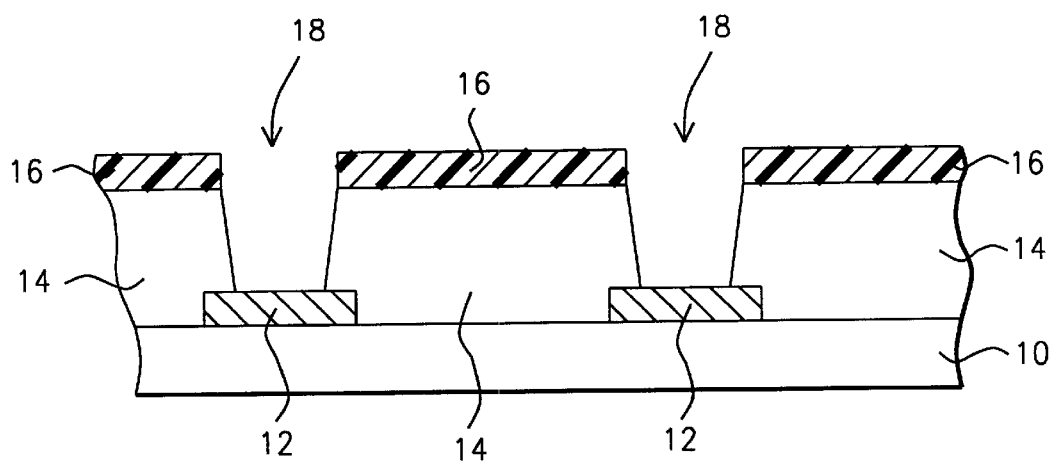
FIGS. 2a through 2e show the process of the invention, as follows.

For reasons of ease of understanding and for comparison purposes, a prior method of creating aluminum solder bumps will first be highlighted. This method is following Chien et al. U.S. Pat. No. 6,130,149, FIGS. 1a through 1f are used for this purpose.

FIG. 1a shows a cross section of a substrate 200 on which are provided:
210, a patterned layer of metal that can comprise aluminum or copper; patterned metal layer 210 provides a point of electrical contact on the surface of substrate 200 and is connected to at least one of the semiconductor devices (not shown) that have been created in or on the surface of substrate 200
212, a pattern of interconnect lines that is adjacent to the patterned metal layer 210;
220, a layer of passivation deposited over the surface of substrate 200; it must be noted that the surface of layer 220 follows the contours of the surfaces of the patterned layer 210 of metal and the interconnect lines 212; under the Chien et al. invention, the main objective is to avoid the accumulation of aluminum in the deep penetrations 223 between adjacent interconnect lines during the process of etching a layer of aluminum for the formation of aluminum contact bumps; this objective remains the same for the current invention but is achieved using a different processing sequence that differs significantly from the processing sequence that has been provided by Chien et al.
230, a layer of SOG, deposited to a thickness between about 2500 and 3500 Angstrom; the layer 230 is planarized after deposition
240, a layer of PEOX, deposited to a thickness between about 900 and 1100 Angstrom; the combined layers 230 and 240 form a composite layer of dielectric overlying the layer 220 of passivation, and
250, a patterned and etched first layer of photoresist; the opening 255 that has been created in the first layer 250 of photoresist aligns with the patterned layer 210 of aluminum.

FIG. 1b shows a cross section after the layers 240 of PEOX, layer 230 of SOG and layer 220 of passivation material have been etched, in accordance with the opening 255 that has been created in the patterned first layer 250 of photoresist (FIG. 1a) and using the patterned first layer of photoresist as a mask, partially exposing the surface of the patterned layer 210 of aluminum. Opening 225 is etched through the three layers 220, 230 and 240. In the cross section that is shown in FIG. 1b, the patterned first layer 250 of photoresist has been removed after the three layers 220, 230 and 240 have been etched.

Figure 2B:
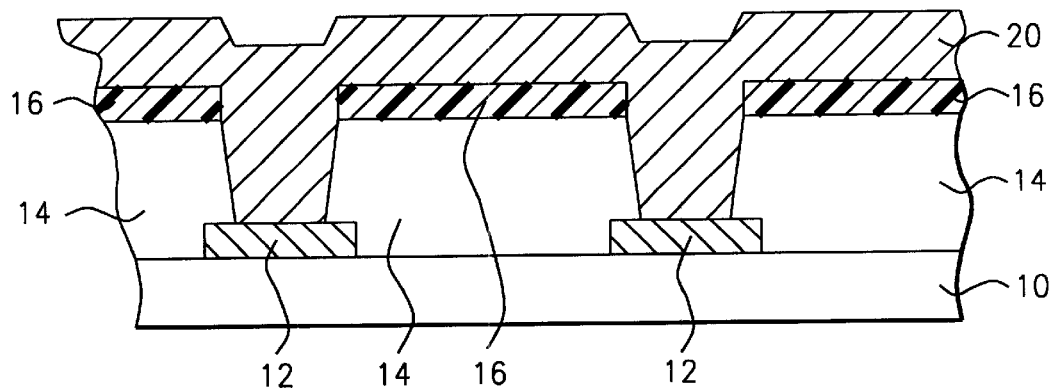

FIG. 1c shows a cross section after a layer 260 of metal, preferably aluminum, has been deposited over the surface of the layer 240 of PEOX and inside opening 225 (FIG. 2b).

Layer 270 has been deposited over the surface of layer 260, this layer is a composite layer that will be patterned to form a hard mask layer overlying the surface the metal pad 210. This layer therefore preferably comprises titanium nitride (serving the function of being an Anti Reflective Coating) and a layer of PEOX, each layer of this composite layer 270 having a thickness of between about 900 and 1100 Angstrom.

FIG. 1d shows a cross section where a second layer 280 of photoresist has been deposited, patterned and etched over the surface of the composite layer 270, leaving a layer of photoresist in place that can serve as a mask for the etching of the underlying layers 270 of composite dielectric and layer 260 of metal. The results of this etch is shown in cross section in FIG. 1e from which it is clear that the (desired) bump 260 is now created overlying patterned metal 210 and making contact therewith.

FIG. 1f shows the final cross section where the (no longer needed) layers 240 and 230 have been removed from above the surface of the layer 220 of passivation.

It is clear from the highlighted sequence of processing steps that, during the critical step of etching the layer 260 for the formation of the interconnect bump 260 of FIG. 1e, the narrow opening 223 was shielded from the processing environment by the overlying layers 230 and 240. No contaminants can therefore penetrate this opening 223 during the aluminum etch.

Further detail relating to the process that has been described above under FIGS. 1a through 1f are as follows:
the layer 220 of passivation can be a composite layer of about 4500 Angstrom PEOX over which about 6300 Angstrom of Plasma Enhanced silicon nitride ($PESi_3N_4$) is deposited
layer 230 of SOG is typically deposited to a thickness of about 3150 Angstrom
layer 240 of PEOX is typically deposited to a thickness of about 1000 Angstrom
the etch that is applied for the etching of the opening 225, FIG. 1b, is a dry etch
after the etch of layers 220, 230 and 240 for the creation of opening 225 (FIG. 1b) has been completed, the first layer 250 (FIG. 1a) of photoresist is striped from the surface of layer 240 of PEOX
the etch that is performed for the etching of bump 260, FIG. 1d, is a wet etch (for the etching of the layer 270 of hard mask and the layer 260 of aluminum) followed by dry etch (for the removal of the layers 240 of PEOX and 230 of SOG)
the patterned second layer 280 of photoresist is removed after layers 270 of hard mask and 260 of aluminum have been etched.

It must further be pointed out that, although the previous process for the creation of an aluminum contact bump that has been highlighted using FIGS. 1a through 1f started with the surface of a substrate 200, this process does not have to start with the surface of a substrate. It is clear that, prior to the processing sequence of FIGS. 1a through 1f, one or more layers of dielectric may have been deposited over the surface of a semiconductor substrate. Interconnect metal (in the form of contact pads, interconnect traces, vias, and the like) may be created in or on the surface of these one or more layers of dielectric with conductive points of electrical contact being provided on the surface of these layers of dielectric. These points of electrical contact that are provided on the surface of these layers of dielectric then take the place of patterned layers of metal 210 and 212 of FIG. 1a, after which the process proceeds as highlighted under FIGS. 1a through 1f.

Next will be explained the improved process for the creation of aluminum contact bumps of the invention, FIGS. 2a through 2d will be used for this purpose.

Referring now specifically to FIG. 2a, there is shown a cross section of a substrate 10 on the surface of which have been provided contact pads 12, preferably comprising aluminum or copper. A layer 14 of passivation has been deposited over the surface of the substrate 10, including the surface of the contact pads 12. A first layer 16 of photoresist has been deposited over the surface of the layer 14 of passivation, this layer 16 has been patterned and etched creating openings 18 in the layer 16 of photoresist that align with the contact pads 12. The layer 14 of passivation has been etched in accordance with the openings 18 that have been created in the first layer 16 of photoresist, partially exposing the surface of the contact pads 12.

It must be emphasized that, although FIGS. 2a through 2d do not show the presence of patterned interconnect metal (traces or lines) in or on the surface of the substrate 10 and therefore do not differentiate between contact pads and closely spaced interconnect traces, these closely spaced interconnect traces are assumed to be present on the surface of substrate 10. The invention and the following description of the invention is not affected by the presence of such interconnect lines, these interconnect lines therefore have no influence on the present description of the invention.

Layer 16 of first layer of photoresist can be created by spin-coating a layer of photoresist over the surface of the passivation layer 14 followed by baking the deposited layer of photoresist. First layer 16 of photoresist can be deposited to a thickness of about 8000 Angstrom, forming a positive photoresist material.

First layer 16 of photoresist can be etched by applying $O_2$ plasma and then wet stripping by using a $H_2SO_4$, $H_2O_2$ and $NH_4OH$ solution. Sulfuric acid ($H_2SO_4$) and mixtures of $H_2SO_4$ with other oxidizing agents such as hydrogen peroxide ($H_2O_2$) are widely used in stripping photoresist after the photoresist has been stripped by other means. Wafers to be stripped can be immersed in the wet stripping mixture at a temperature between about 100 degrees C. and about 150 degrees C. for 5 to 10 minutes and then subjected to a thorough cleaning with deionized water and dried by dry nitrogen. Inorganic resist strippers, such as the sulfuric acid mixtures, are very effective in the residual free removal of highly postbaked resist. They are more effective than organic strippers and the longer the immersion time, the cleaner and more residue free wafer surface can be obtained. A photoresist developer often used during development of the photoresist is tetramethyl ammonium hydroxide (TMAH). Other developers such as sodium hydroxide, sodium metasillicide or potassium hydroxide may also be used. However, one of the properties of TMAH relative to other developers is that it is a metal-ion free developer which reduces metal-ion diffusion and contamination in other parts of the IC.

The layer 14 of passivation preferably comprises a composite layer of about 4500 Angstrom PEOX over which Plasma Enhanced silicon nitride ($PESi_3N_4$) is deposited to a thickness of about 6300 Angstrom.

The layer of Plasma Enhanced silicon nitride ($PESi_3N_4$) can be deposited using PECVD procedures at a pressure between about 300 mTorr and 400 mTorr, at a temperature between about 600 and 800 degrees C., to a thickness between about 5000 and 7500 Angstrom and more preferably to a thickness of about 6300 Angstrom using $NH_3$ and $SiH_4$.

It must be noted that, in variance with previous processing sequences as highlighted under FIGS. 1a through 1f, no layer of SOG and no layer of PEOX are deposited over the composite layer 14 of passivation. It must further be noted that the patterned first layer 16 of photoresist is not removed after openings 18 have been created in the layer 14 of passivation.

Next, FIG. 1b a layer 20 of metal, preferably of aluminum-copper (AlCu) alloy, is sputter deposited over the surface of the patterned layer 16 of photoresist, including the openings 18 that have been created in the layer 14 of passivation. Layer 20 is deposited preferably to a thickness between about 5.5 and 6.5 $\mu$m, from this layer 20 of metal the contact bumps will be formed as shown in subsequent drawings. The preferred material to be used for layer 20 is a aluminum-copper (AlCu) alloy, wherein the copper concentration comprises no more than 20% of the combined weight of the AlCu layer.

Figure 2C:
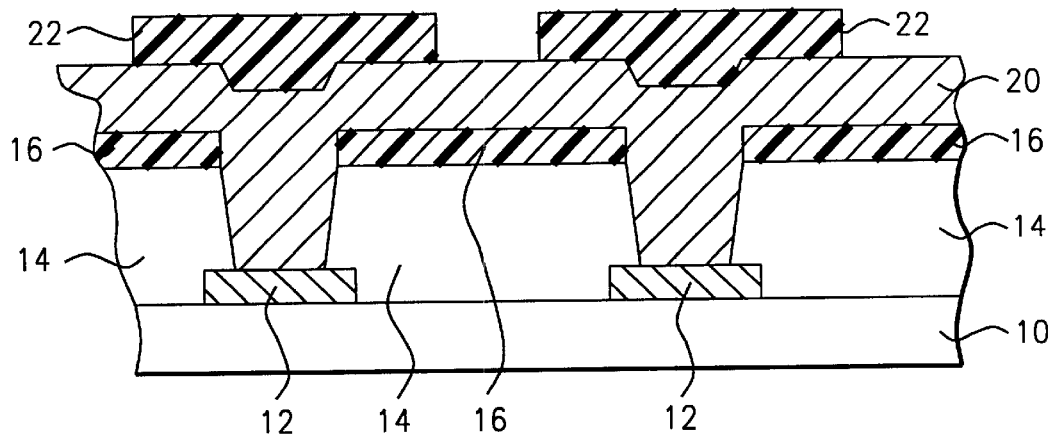

After layer 20 has been deposited, a second layer 22 of photoresist is deposited over the surface of the layer 20 of metal, the layer 22 is patterned and etched leaving layers 22 of photoresist in place that overlay and align with the contact pads 12, FIG. 2c. Processing conditions of deposition and etching that have previously been highlighted under FIG. 2a, relating to layer 16 of photoresist, equally apply to layer 22 of photoresist of FIG. 2c and will therefore not be repeated at this time. Second layer 22 of photoresist can be deposited to a thickness of about 8000 Angstrom, forming a positive photoresist material.

Using the patterned layer 22 as a mask, the layer 20 of preferably AlCu is etched using a recipe comprising $BCl_3$, $Cl_2$, $N_2$ and $CF_4$. This etch, as shown in FIG. 2d, removes the layer 20 in regions 26 that are interspersed with the contact pads 12 and leaves the layer 20 in place where this layer overlays and aligns with the contact pads 12, creating the contact bumps 28.

Figure 2D:
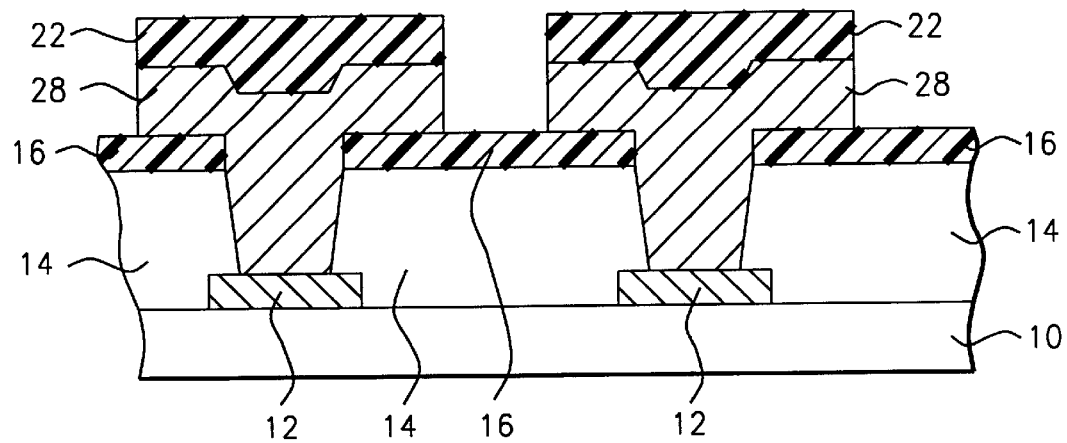
Figure 2E:
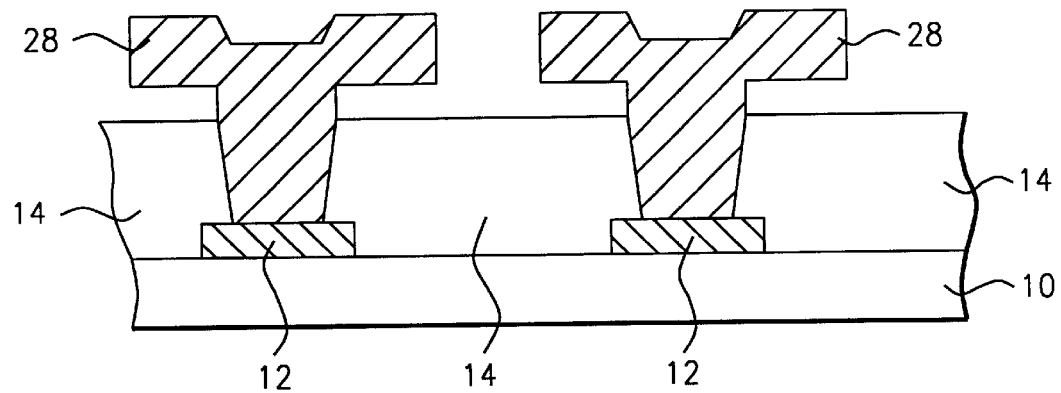

FIG. 2d shows, significantly, that exposed surfaces of the structure after the layer 20 of aluminum has been etched, that is surfaces of layers 16 and 22, comprise photoresist only, with the exception of the exposed sidewalls of the contact bumps 28. This observation leads to the final step in the process of the invention, that is the simultaneous removal of the patterned first layer 16 and second layer 22 of photoresist. From the cross section that is shown in FIG. 2d, it is clear that contact bumps 28 significantly protrude from the layer 14 of passivation, as desired, while underlying devices and device features remain protected by the layer 14 of passivation. Processing conditions relating to photoresist removal that have previously been highlighted as relating to layer 16 of photoresist, FIG. 2a, equally apply to the removal of layers 16 and 22 of photoresist, FIG. 2d, and will therefore not be repeated at this time.

From the above highlighted processing sequence that is used for the creation of aluminum contact bumps, the following can be concluded, specifically where this relates to the processing steps that have been highlighted under FIGS. 1a through 1f.

The invention:
does not use a layer of SOG as part of the creation of a passivation layer overlying the patterned interconnect metal
does not use a layer of PEOX overlying a created composite layer of passivation
does not remove the first layer of patterned photoresist after openings have been etched in the layer of passivation, and
applies one step of photoresist removal, this step being applied after the contact bumps have been created, removing in one step two layers of patterned photoresist, thereby saving one step of photoresist removal.

An overview of the above observations is shown next.

| Process | Prior Art | Invention |
|---|---|---|
| Passivation layer | PEOX - 4500 A°<br>PESi₃N₄ - 63000 A°<br>SOG - 3150 A°<br>PEOX - 1000 A° | PEOX - 4500 A°<br>PESi₃N₄ - 63000 A° |
| PA1-PH | AZ6130:4.10 | AZ6130:4.10 |
| PA1-ET | Dry | Dry |
| PR Strip | Yes | No |
| Sputter | AlCu (2/2/2 μm) | AlCu (2/2/2 μm) |
| Bump-PH | AZ6130:4.10 | AZ6130:4.10 |
| Bump Etch | Cry + Wet | Cry + Wet |
| PR Strip | Yes | Yes |

The following comments apply that relate both to the above table and to the invention.

PA1-PH is the photoresist that is used for the patterning of the layer of passivation PA1-ET is the etching of the layer of passivation AlCu (2/2/2 μm), the total thickness of the deposited layer of aluminum will be 6 μm, this layer is deposited using three cycles of deposition, each cycle sputtering 2 μm of aluminum. The three cycles are required because the sputter temperature, about 200 degrees C., is too high for the equipment, requiring step wise deposition without subjecting the sputter apparatus to excessive temperature stress AZ6130:4.10 is the photoresist that is used for the bump layer of photoresist (Bump-PH)

the etch conditions that are applied for the PA1-ET are conventional conditions of dry etch the invention continues to apply a dry and wet etch for the etch of the layer of aluminum (bump etch). It is required to add the wet etch after the dry etch has been completed in order to remove metal (Al) residue. Since the layer of aluminum is 6 μm thick, a dry etch does not remove all the aluminum and must therefore be followed by a wet etch. The processing conditions for the dry etch of the layer of aluminum are convention dry etch conditions. The processing conditions for the wet etch of the layer of aluminum are conventional Al/Si/Cu wet etch conditions prior art (FIGS. 1a through 1f) includes the use of the hard mask layer 270 under the layer 280 of photoresist, this to make sure that the bump etch will be complete and does not damage the surface of the bump layer of aluminum in the interface between the layer of photoresist and the layer of aluminum the invention makes use of the fact that the layer 280 of photoresist is considered thick enough to provide protection of the bump layer of aluminum during the (second or) wet etch of this layer of aluminum the invention does not use a hard mask layer and therefore does not have to remove the hard mask layer after the bump etch has been completed. This is an advantage because the removal of a hard mask layer is a cumbersome and difficult process and is therefore costly. As an extension of the invention, the use of a hard mask layer can be considered. In this case, the processing steps that are required for removal of the hard mask are the same as prior art processing steps the invention uses the layer (16, FIG. 2a) of photoresist, a layer which remains in place during the bump etch, in place of the layers of SOG and PEOX of prior art. This layer 16 of photoresist protects that surface of the underlying layer 20 (FIG. 2b) of aluminum during the dump etch.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. An aluminum bump process, comprising the steps of:

providing a silicon substrate having contact pads provided thereon;

forming a composite layer of passivation over the surface of said silicon substrate and said contact pads;

depositing a first layer of photoresist over the surface of said composite layer of passivation;

patterning and developing said first layer of photoresist and said composite layer of passivation, creating first openings through said first layer of photoresist and said composite layer of passivation, exposing said contact pads through said first openings;

forming a layer of bump metal over the surface of said patterned and developed first layer of photoresist, filling said first openings;

depositing a second layer of photoresist over the surface of said layer of bump metal;

patterning and developing said second layer of photoresist, forming second openings through said second layer of photoresist, said second openings being aligned with said patterned and developed first layer of photoresist;

etching said layer of bump metal in accordance with said second openings created through said second layer of photoresist, exposing said patterned and developed first layer of photoresist; and removing said patterned and developed first layer of photoresist and said patterned and developed second layer of photoresist.

2. The method of claim 1, said passivation layer comprising a layer of plasma enhanced oxide (PEOX), deposited to a thickness between about 4000 and 5000 Angstrom over which a layer of plasma enhanced silicon nitride (PESi₃N₄) is deposited to a thickness between about 6000 and 6500 Angstrom.

3. The method of claim 1, said layer of bump metal comprising aluminum-copper alloy, having been deposited to a thickness between about 5.5 and 6.5 μm.

4. The method of claim 1, said etching said layer of bump metal comprising using a recipe of BCl₃, Cl₂, N₂ and CF₄.

5. The method of claim 1, said contact pads comprising aluminum or copper.

6. The method of claim 1, said first photoresist layer being deposited to a thickness of about 8000 Angstrom.

7. The method of claim 1, said second photoresist layer being deposited to a thickness of about 8000 Angstrom.

8. The method of claim 1, said removing said patterned and developed first and second photoresist layers comprising applying a mixture of inorganic photoresist strippers at a temperature between about 100 degrees C. and 150 degrees C. for between about 5 and 10 minutes, followed by a thorough cleaning with deionized water and drying by dry nitrogen.

9. The method of claim 1, said etching said layer of bump metal comprising dry etching and wet etching.

10. An aluminum bump process, comprising the steps of:

providing a silicon substrate layer having contact pads disposed thereon;

forming a layer of passivation material over the surface of said silicon substrate and the surface of said contact pads;

depositing a first etch resistant layer over the surface of said layer of passivation material;

patterning said developing said first etch resistant layer and said layer of passivation material, forming first openings there-through, exposing said contact pads through said first openings;

forming a bump metal layer over the surface of said patterned and developed first etch resistant layer, filling said first openings;

depositing a second etch resistant layer over the surface of said bump metal layer;

patterning and developing said second etch resistant layer, forming second openings through said second etch resistant layer, said second openings being aligned with said patterned and developed first etch resistant layer;

etching said bump metal layer in accordance with said second openings created through said second etch resistant layer, exposing said patterned and developed first etch resistant layer; and removing said patterned first etch resistant layer and said second etch resistant layer.

11. The method of claim 10, wherein said first etch resistant layer comprising photoresist.

12. The method of claim 10, wherein said second etch resistant layer comprising photoresist.

13. The method of claim 10, said passivation layer comprising a layer of plasma enhanced oxide (PEOX), deposited to a thickness between about 4000 and 5000 Angstrom, and a layer of plasma enhanced silicon nitride ($PESi_3N_4$), deposited to a thickness between about 6000 and 6500 Angstrom.

14. The method of claim 10, said bump metal layer comprising aluminum-copper alloy, having been deposited to a thickness between about 5.5 and 6.5 $\mu$m.

15. The method of claim 10, said etching said bump metal layer comprising a recipe of $BCl_3$, $Cl_2$, $N_2$ and $CF_4$.

16. The method of claim 10, said contact pads comprising aluminum or copper.

\* \* \* \* \*